(12) United States Patent
Labach

(10) Patent No.: US 11,811,542 B1
(45) Date of Patent: Nov. 7, 2023

(54) GALVANIC ISOLATION CIRCUITRY AND ASSOCIATED LOW POWER WAKEUP METHODS

(71) Applicant: NDSL, Inc., Raleigh, NC (US)

(72) Inventor: Frederick Avery Labach, Raleigh, NC (US)

(73) Assignee: NDSL, Inc., Raleigh, NC (US)

( * ) Notice: Subject to any disclaimer, the term of this patent is extended or adjusted under 35 U.S.C. 154(b) by 0 days.

(21) Appl. No.: 17/829,760

(22) Filed: Jun. 1, 2022

(51) Int. Cl.
H04L 29/06 (2006.01)
H04L 12/12 (2006.01)

(52) U.S. Cl.
CPC .................................. H04L 12/12 (2013.01)

(58) Field of Classification Search
CPC ........... G06N 3/08; H04L 12/40; H04L 63/14; H04L 63/1416; H04L 2012/40267; G05B 19/042; Y04S 40/20; G06F 11/3051; G06F 11/3006; G06F 11/3027; G01B 11/026; G01B 11/26; G01B 15/00; G01S 15/42; G01S 17/08; G01S 13/878; G01S 15/08; G01S 2013/468
See application file for complete search history.

(56) References Cited

U.S. PATENT DOCUMENTS

| 11,255,663 B2 * | 2/2022 | Binder .................... G01B 11/26 |
| 2003/0158990 A1 * | 8/2003 | Allen .................. G06F 13/4086 710/305 |
| 2010/0072966 A1 * | 3/2010 | Mayell .............. H02M 3/33523 323/284 |

(Continued)

FOREIGN PATENT DOCUMENTS

| CN | 103558848 A | 2/2014 |
| CN | 211267029 U | 8/2020 |

(Continued)

OTHER PUBLICATIONS

Electrical Engineering: "LED PWM with FOD8342 Optocoupler", Jan. 6, 2020, https://electronics.stackexchange.com/questions/474786/led-pwm-with-fod8342-optocoupler, 5 pages.

(Continued)

*Primary Examiner* — Jung Liu

(74) *Attorney, Agent, or Firm* — NK Patent Law

(57) ABSTRACT

Disclosed herein are methods, systems, and devices for providing galvanic isolation and low power wakeup of circuitry. According to one embodiment, an apparatus includes first isolation circuitry, second isolation circuitry, and first control circuitry. The first isolation circuitry includes a first primary interface and a first secondary interface. The first primary interface is galvanically isolated from the first secondary interface. The second isolation circuitry includes a second primary interface and a second secondary interface. The second primary interface is galvanically isolated from the second secondary interface. The first control circuitry is electrically coupled with the first secondary interface and the second secondary interface. The first control circuitry is configured to transition the apparatus from a sleep state to a wake state upon receiving a wake signal and the first isolation circuitry is configured to provide the wake signal to the first control circuitry via the first secondary interface.

23 Claims, 6 Drawing Sheets

(56) References Cited

U.S. PATENT DOCUMENTS

| | | | | |
|---|---|---|---|---|
| 2015/0254206 A1* | 9/2015 | Biskup | ............... | G06F 13/4068 |
| | | | | 710/110 |
| 2021/0350237 A1* | 11/2021 | Litichever | ............... | G06N 3/08 |
| 2022/0128352 A1* | 4/2022 | Binder | ............... | G01B 11/026 |

FOREIGN PATENT DOCUMENTS

| | | | |
|---|---|---|---|
| EP | 3151409 | B1 | 11/2020 |
| KR | 20130032355 | A | 4/2013 |
| WO | 2001029150 | A2 | 4/2001 |
| WO | 2013184074 | A1 | 12/2013 |

OTHER PUBLICATIONS

Electrical Engineering: "Opto-coupled PWM output", May 16, 2016, https://electronics.stackexchange.com/questions/234520/opto-coupled-pwm-output, 3 pages.

\* cited by examiner

GALVANIC ISOLATION CIRCUITRY AND ASSOCIATED LOW POWER WAKEUP METHODS

TECHNICAL FIELD

The present invention relates generally to galvanic isolation and more specifically to galvanic isolation and low power wakeup of circuitry.

BACKGROUND

Under certain design restraints, galvanic isolation between two of more sections of circuitry must be incorporated. When one of these sections operate in a low power state (e.g., sleep state) waking the section without using excess power can be difficult. For example, a battery or a capacitor may be used for power and wakeup circuitry remaining under power may prematurely drain the battery or capacitor.

As such, new methods, systems, and devices are needed for providing galvanic isolation and low power wakeup of circuitry.

SUMMARY

Disclosed herein are methods, systems, and devices for providing galvanic isolation and low power wakeup of circuitry. According to one embodiment, an apparatus includes first isolation circuitry, second isolation circuitry, and first control circuitry. The first isolation circuitry includes a first primary interface and a first secondary interface. The first primary interface is galvanically isolated from the first secondary interface. The second isolation circuitry includes a second primary interface and a second secondary interface. The second primary interface is galvanically isolated from the second secondary interface. The first control circuitry is electrically coupled with the first secondary interface and the second secondary interface. The first control circuitry is configured to transition the apparatus from a sleep state to a wake state upon receiving a wake signal and the first isolation circuitry is configured to provide the wake signal to the first control circuitry via the first secondary interface.

In some embodiments, the first control circuitry is configured to receive a first digital communication signal from second control circuitry via the second isolation circuitry. In further embodiments, the first control circuitry is further configured to transmit a second digital communication signal to the second control circuitry via the second isolation circuitry. In still further embodiments, the first control circuitry may be galvanically isolated from the second control circuitry.

In some embodiments, the apparatus may further include detection circuitry electrically coupled between the first primary interface and the second primary interface.

In some embodiments, the detection circuitry may be configured to provide the wake signal to the first primary interface upon detecting the first digital communication signal arriving at the second primary interface.

In some embodiments, the second isolation circuitry may be configured to be powered down during the sleep state and powered up during the wake state.

In some embodiments, the first isolation circuitry may include an optocoupler to provide galvanic isolation. In further embodiments, the optocoupler may include a pair of input terminals configured to receive the wake signal and an output transistor having a collector and an emitter. The collector may be electrically coupled with the first control circuitry and the collector may be configured to provide the wake signal to the first control circuitry.

In some embodiments, the second isolation circuitry may include a digital isolator to provide galvanic isolation.

In some embodiments, the first isolation circuitry may include a first transformer to provide galvanic isolation. In further embodiments, the second isolation circuitry may include a second transformer to provide galvanic isolation. In still further embodiments, the second isolation circuitry may also include a third transformer to provide galvanic isolation.

In other embodiments, the first isolation circuitry may include a first capacitor to provide galvanic isolation. In further embodiments, the second isolation circuitry may include a second capacitor to provide galvanic isolation. In still further embodiments, the second isolation circuitry may also include a capacitor to provide galvanic isolation.

In other embodiments, the first isolation circuitry may include a photovoltaic detector and the second isolation circuitry may include an optical transceiver.

In some embodiments, the apparatus may further include a battery. The battery may be configured to power the second secondary interface of the second isolation circuitry during the wake state. In other embodiments, the apparatus may further include a capacitor. The capacitor may be configured to power the second secondary interface of the second isolation circuitry during the wake state.

In some embodiments, the apparatus may provide a compliant interface to a controller area network (CAN) bus, a media oriented systems transport (MOST) bus, or the like. In other embodiments, the apparatus may provide an RS-485 compliant interface, an RS-422 interface, or the like.

In another embodiment, a method of operating an apparatus for providing wakeup of galvanically isolated circuitry within the apparatus is disclosed. The apparatus includes first isolation circuitry, second isolation circuitry, and first control circuitry. The first isolation circuitry includes a first primary interface and a first secondary interface. The first primary interface is galvanically isolated from the first secondary interface. The second isolation circuitry includes a second primary interface and a second secondary interface. The second primary interface is galvanically isolated from the second secondary interface. The first control circuitry is electrically coupled with the first secondary interface and the second secondary interface. The method includes (1) receiving a first digital communication signal, (2) generating a wake signal upon receiving the first digital communication signal, (3) providing the wake signal to the first control circuitry using the first isolation circuitry, and (4) transitioning the first control circuitry from a sleep state to a wake state.

In some embodiments, the method may further include transitioning the second isolation circuitry from a power-down state to a power-up state upon transitioning the first control circuitry from the sleep state to the wake state.

In some embodiments, the method may further include providing a portion of the first digital communication signal to the first control circuitry via the second isolation circuitry. In further embodiments, the first digital communication signal may include a first preamble and a first data packet having a plurality of bytes.

In some embodiments, the method may further include providing a second digital communication signal from the first control circuitry to second control circuitry via the second isolation circuitry. In further embodiments, the second digital communication signal may include a second preamble and a second data packet.

In another embodiment, a method of manufacture of an apparatus is disclosed. The method includes installing first isolation circuitry, second isolation circuitry, and first control circuitry onto a printed circuit board (PCB). The first isolation circuitry includes a first primary interface and a first secondary interface. The first primary interface is galvanically isolated from the first secondary interface. The second isolation circuitry includes a second primary interface and a second secondary interface. The second primary interface is galvanically isolated from the second secondary interface. The first control circuitry is electrically coupled with the first secondary interface and the second secondary interface. The first control circuitry is configured to transition the apparatus from a sleep state to a wake state upon receiving a wake signal and the first isolation circuitry is configured to provide the wake signal to the first control circuitry via the first secondary interface.

Is some embodiments, the method further includes installing detection circuitry, an isolated power source, and a switch onto the PCB.

The features and advantages described in this summary and the following detailed description are not all-inclusive. Many additional features and advantages will be apparent to one of ordinary skill in the art in view of the drawings, specification, and claims presented herein.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1:
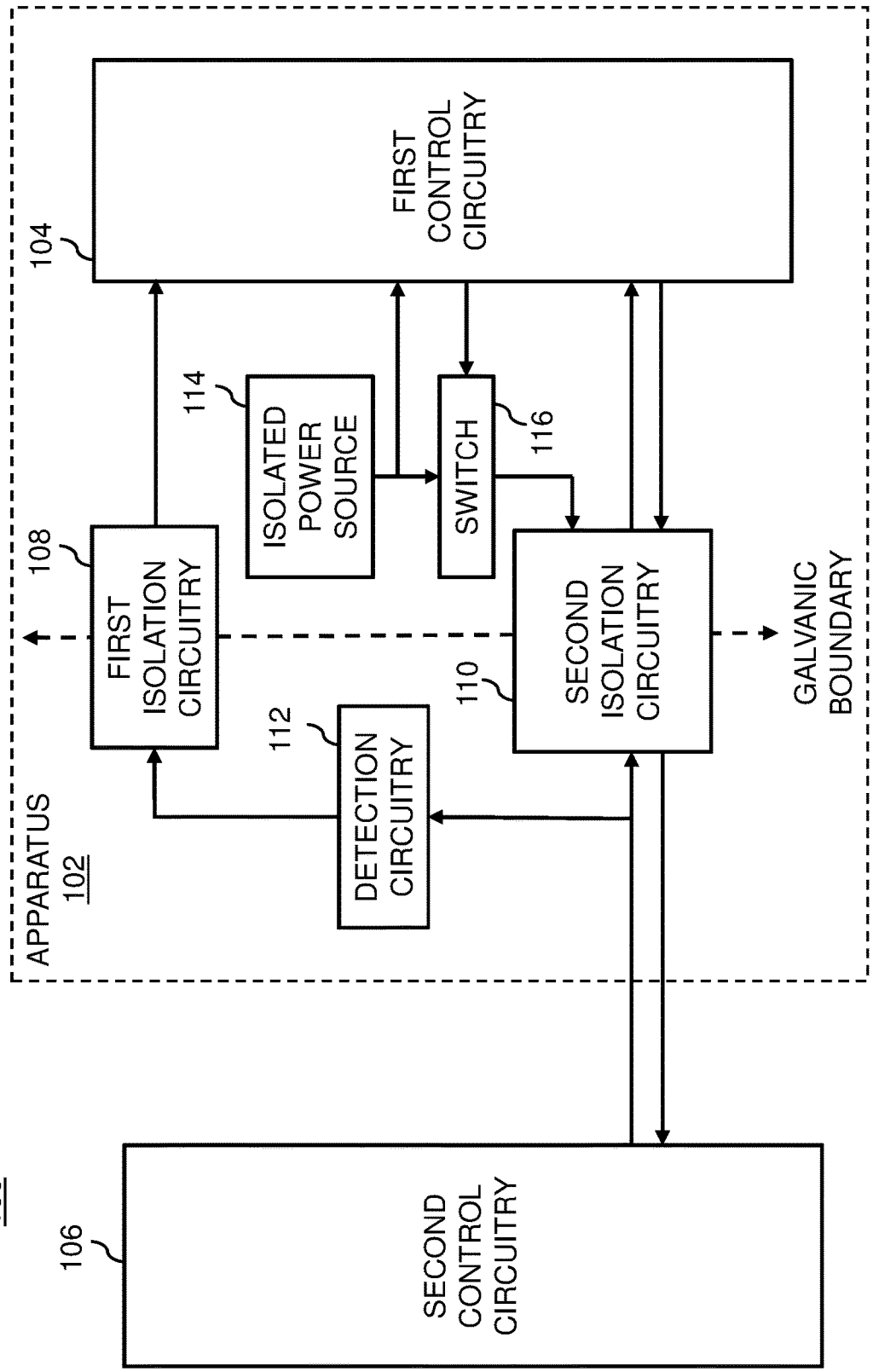
FIG. 1 depicts a block diagram illustrating an apparatus configured for galvanic isolation (via a galvanic boundary) in accordance with embodiments of the present disclosure.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

Methods, systems, and devices are disclosed herein for providing galvanic isolation and low power wakeup of electronic circuitry. FIG. 1 depicts a block diagram 100 illustrating an apparatus 102 configured for galvanic isolation (via a galvanic boundary) in accordance with embodiments of the present disclosure. The apparatus 102 includes first control circuitry 104 configured to communicate bydirectionally with second control circuitry 106. The apparatus 102 also includes first isolation circuitry 108, second isolation circuitry 110, detection circuitry 112, an isolated power source 114, and a switch 116.

The first isolation circuitry 108 includes a first primary interface and a first secondary interface. The first primary interface is galvanically isolated from the first secondary interface. The first isolation circuitry 108 may include an optocoupler, a transformer, a capacitor, and/or the like.

The second isolation circuitry 110 includes a second primary interface and a second secondary interface. The second primary interface is galvanically isolated from the second secondary interface. As such, the first control circuitry 104 is galvanically isolated from the second control circuitry 106. The second isolation circuitry 110 may also include a digital isolator, a transformer, a capacitor, and/or the like. The second isolation circuitry 110 is configured to be powered down during the sleep state and powered up during the wake state.

The first control circuitry 104 is electrically coupled with the first secondary interface and the second secondary interface. The first control circuitry 104 is configured to transition the apparatus 102 from a sleep state to a wake state.

The isolated power source 114 is configured to provide power to the second isolation circuitry 110 via the switch 116. The switch 116 is configured to be activated and deactivated by the first control circuitry 104. The isolated power source 114 may include a battery, a capacitor, and/or the like.

The first control circuitry 104 is configured to receive a first digital communication signal from the second control circuitry 106 via the second isolation circuitry 110. The first control circuitry is further configured to transmit a second digital communication signal to the second control circuitry via the second isolation circuitry 110.

The detection circuitry 112 is electrically coupled between the first primary interface and the second primary interface. The detection circuitry 112 is configured to provide the wake signal to the first primary interface upon detecting the first digital communication signal arriving at the second primary interface.

Figure 2:
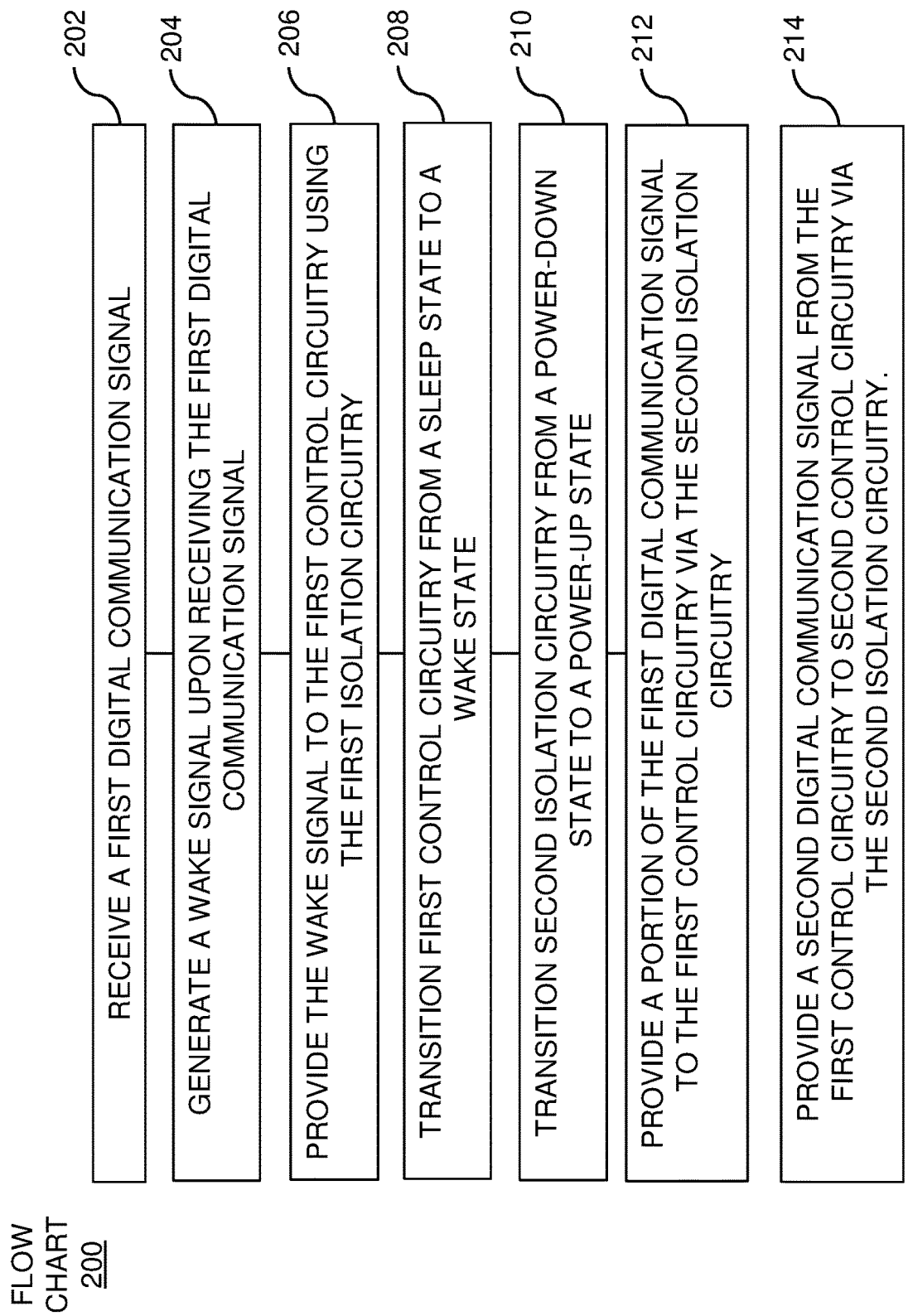
FIG. 2 depicts a flowchart illustrating a method for providing wakeup of galvanically isolated circuitry within an apparatus in accordance with embodiments of the present disclosure.

FIG. 2 depicts a flowchart 200 illustrating a method for providing wakeup of galvanically isolated circuitry within an apparatus in accordance with embodiments of the present disclosure. The apparatus includes first isolation circuitry having a first primary interface and a first secondary interface. The first primary interface is galvanically isolated from the first secondary interface. The apparatus further includes second isolation circuitry having a second primary interface and a second secondary interface. The second primary interface is galvanically isolated from the second secondary interface. The apparatus additionally includes first control circuitry electrically coupled with the first primary interface and the second primary interface.

In step 202, the method includes receiving a first digital communication signal. The first digital communication signal may include a first preamble and a first data packet.

In step 204 the method further includes generating a wake signal upon receiving the first digital communication signal. The wake signal may be generated upon receiving the first preamble.

In step 206, the method further includes providing the wake signal to the first control circuitry using the first isolation circuitry.

In step 208, the method further includes transitioning the first control circuitry from a sleep state to a wake state upon providing the wake signal using the first isolation circuitry.

In step 210, the method further includes transitioning the second isolation circuitry from a power-down state to a power-up state upon transitioning the first control circuitry from the sleep state to the wake state.

In step 212, the method further includes providing a portion of the first digital communication signal to the first control circuitry via the second isolation circuitry.

In step 214, the method further includes providing a second digital communication signal from the first control circuitry to second control circuitry via the second isolation circuitry. The second digital communication signal may include a second preamble and a second data packet. The second control circuitry may be within the apparatus or external to the apparatus.

Figure 3:
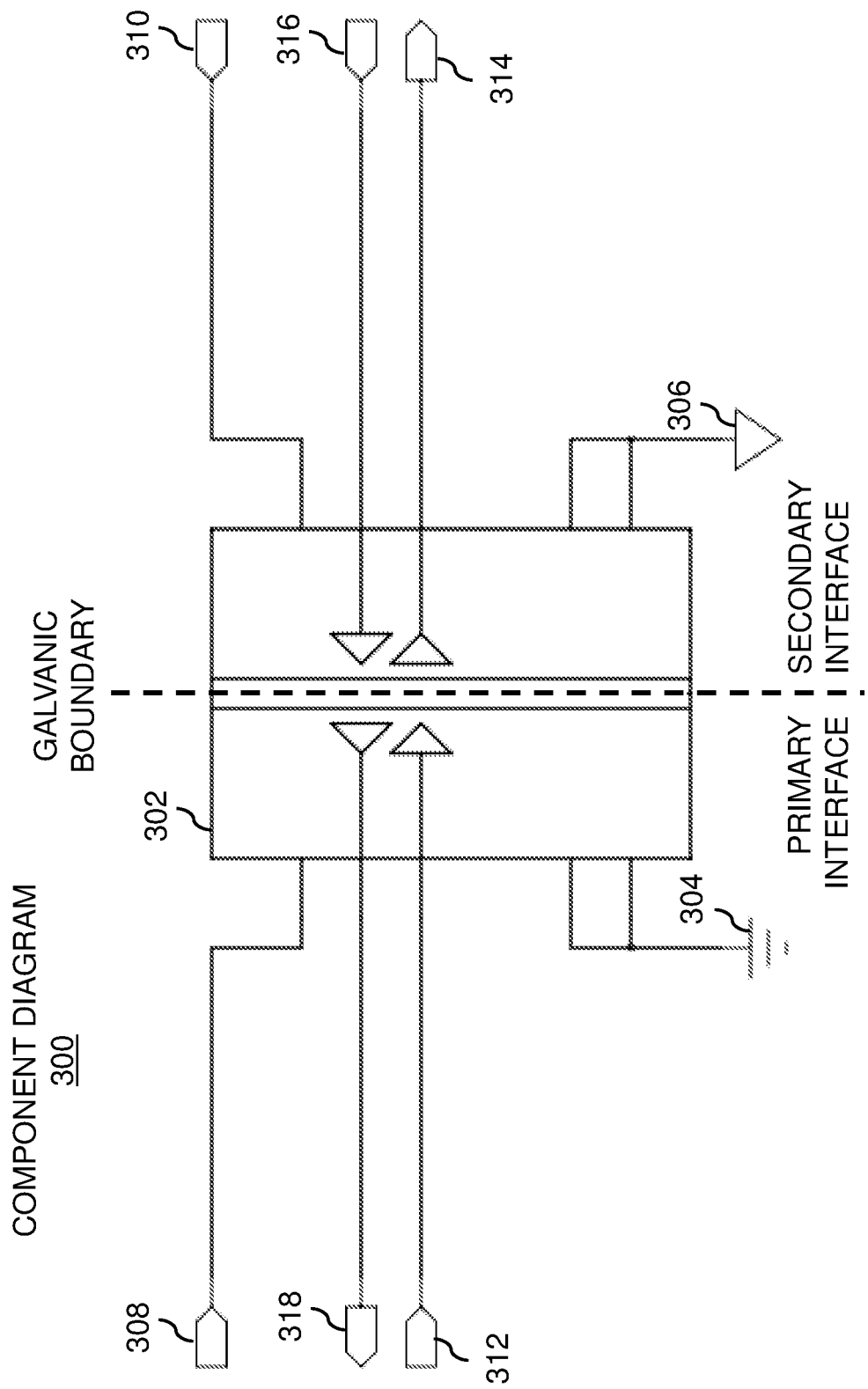
FIG. 3 depicts component diagram illustrating a digital isolator configured to provide galvanic isolation in accordance with embodiments of the present disclosure.

Communications across an interface having galvanic isolation are often achieved using digital isolators. These digital isolators are made by several manufacturers and allow high speed signals to be transferred across a high voltage or separated extra low voltage (SELV) divide. The most common and least expensive digital isolators require that each side of the interface be supplied with its own power source. FIG. 3 depicts a component diagram 300 illustrating a digital isolator 302 configured to provide galvanic isolation in accordance with embodiments of the present disclosure. As an example, the digital isolator 302 may be implemented within a Texas Instrument® ISO774x series quad-channel digital isolator, or the like.

The digital isolator 302 is configured to be connected to a system ground 304 on a primary interface and an isolated ground 306 on a secondary interface. The digital isolator is also configured to be connected to a system power source 308 on the primary interface and an isolated power source 310 on the secondary interface. The digital isolator 302 is further configured to receive a first digital communication signal on non-isolated receive port 312 of the primary interface and provide the first digital communication signal on the isolated receive port 314 of the secondary interface. Additionally, the digital isolator 302 is further configured to receive a second digital communication signal on isolated transmit port 316 of the secondary interface and provide the second digital communication signal on the non-isolated receive port 318 of the primary interface.

The non-isolated receive port 312 and the non-isolated transmit port 318 may be connected to a dedicated host processor using point-to-point wiring or a parallel bus on a printed circuit board (PCB) assembly also hosting isolated circuitry connected with the secondary interface of digital isolator 302. For example interconnects may be provided by an inter-integrated circuit (I²C) interface or the like. In other embodiments, the non-isolated receive port 312 and the non-isolated transmit port 318 may be connected to a remote processor over point-to-point wiring or a parallel bus. For example, interconnects may be provided by an RS-485 compliant interface, an RS-422 interface, a controller area network (CAN) bus interface, or the like.

The circuitry of digital isolator 302 typically requires only a few milliamps of supply current to power the primary interface and the secondary interface. Often this is not a design concern because there is an isolated power source available that can be used continuously without consequence of current drain. However, sometimes the power available for the isolated circuitry is limited and cannot support continuous operation of the communication interface. This is the case when the isolated circuitry is powered from a battery a capacitor, and/or the like. To preserve energy stored in the battery and/or the capacitor, a processor in the isolated section would need to power off all possible loads and enter a sleep state (e.g., an extremely low power state) until the processor was required to wake up and perform an action. In an application where the digital isolator 302 is also powered off in this process, the processor on the secondary interface would be unable to receive any communications (e.g., data and/or commands) from non-isolated circuitry of the primary interface. Ideally a controlling processor within the non-isolated circuitry would be able to wake up the processor on the secondary interface whenever needed to communicate, without requiring any additional signals or physical connections dedicated to this function, and also without placing additional power demands on the isolated circuitry. The previously disclosed apparatus 102 in block diagram 100 of FIG. 1 and the method disclosed in flow chart 200 of FIG. 2 provide an effective solution for waking up such a processor.

Figure 4:
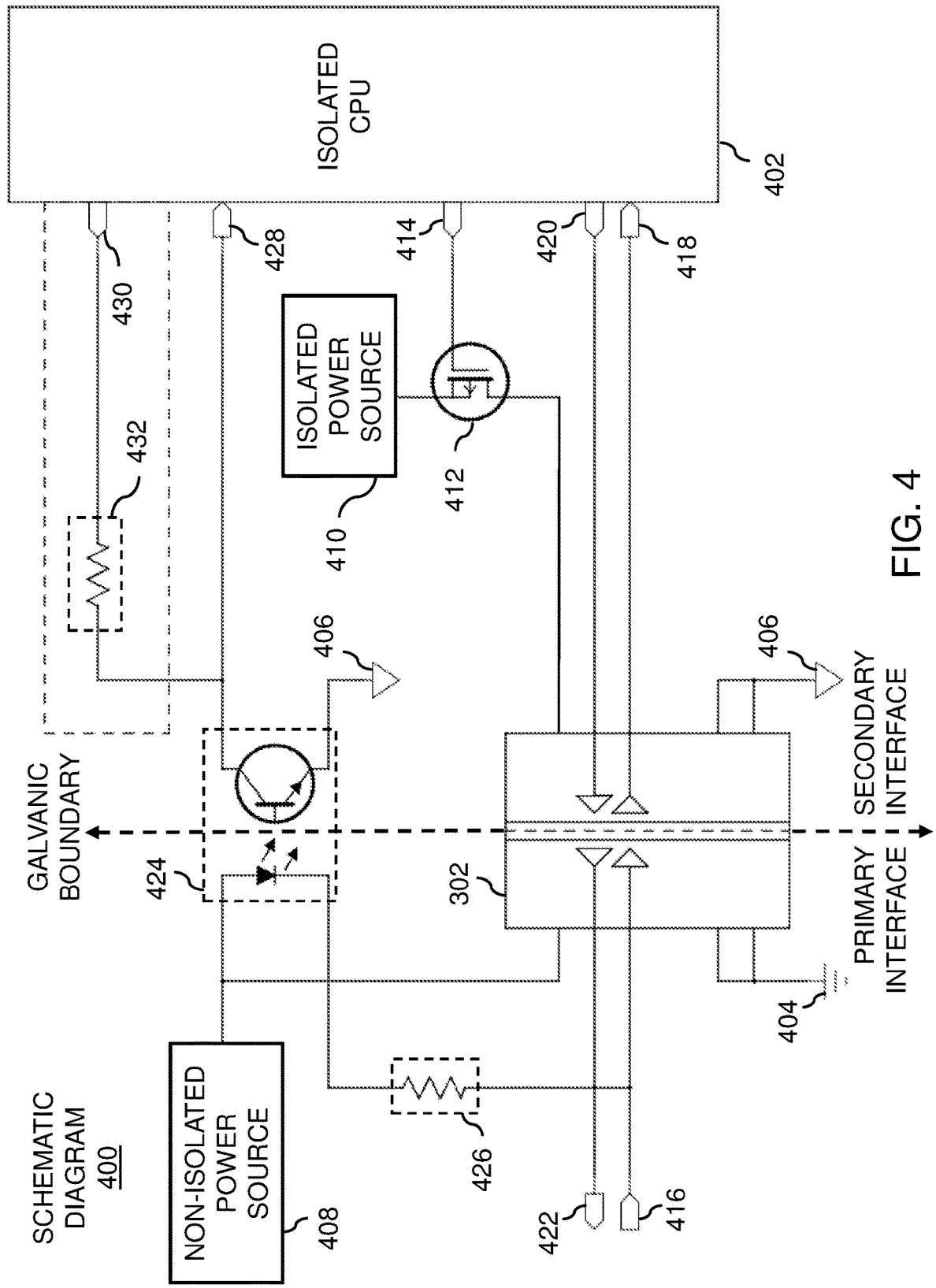
FIG. 4 depicts a schematic diagram illustrating circuitry having a galvanic boundary in accordance with embodiments of the present disclosure.

FIG. 4 depicts a schematic diagram 400 illustrating circuitry having a galvanic boundary in accordance with embodiments of the present disclosure. The circuitry includes an isolated central processing unit (CPU) 402 (i.e. first control circuitry) and the digital isolator 302 of FIG. 2 (i.e. second isolation circuitry).

The digital isolator 302 is connected to a system ground 404 on a primary interface and an isolated ground 406 on a secondary interface. The digital isolator 302 is also connected to a non-isolated power source 408 on the primary interface and an isolated power source 410 (via a switch 412) on the secondary interface. The isolated CPU 402 is configured to enable the switch 412 during a wake mode and disable the switch 412 during a sleep mode via port 414. The switch 412 may be a P-channel enhancement mode metal-oxide-semiconductor field-effect transistor (MOSFET) as shown in FIG. 4, or any type of electronic switch supporting a suitable turn-on time.

The digital isolator 302 is further configured to receive a first digital communication signal on a non-isolated receive port 416 of the primary interface and provide the first digital communication signal on an isolated receive port 418 of the secondary interface to the isolated CPU 402. The first digital communication signal may include a first preamble and a first data packet having a first plurality of bytes. Additionally, the digital isolator 302 is further configured to receive a second digital communication signal on an isolated transmit port 420 of the secondary interface from the isolated CPU 402 and provide the second digital communication signal on a non-isolated transmit port 422 of the primary interface. The second digital communication signal may include a second preamble and a second data packet having a first plurality of bytes.

The non-isolated receive port 416 and the non-isolated transmit port 422 may be connected to a dedicated host processor (i.e. second control circuitry) using point-to-point wiring or a parallel bus on a PCB assembly with the circuitry of schematic diagram 400. These interconnects may be provided by an I²C interface or the like.

In other embodiments, the non-isolated receive port 416 and the non-isolated transmit port 422 may be connected to a remote processor (i.e. second control circuitry) over point-to-point wiring or a parallel bus. These interconnects may be provided by an RS-485 compliant interface, an RS-422 interface, a CAN bus interface, or the like.

The circuitry also includes optocoupler 424 (i.e. first isolation circuitry) and detection resistor 426 (i.e. detection circuitry) configured for providing a wake signal to isolated CPU 402 via an interrupt port 428. Detection resistor 426 (i.e. detection circuitry) is electrically coupled between the non-isolated receive port 416 and an input cathode of the optocoupler 424. In some embodiments, the detection resistor 426 may be between one kilo-ohm and one hundred kilo-ohms. In certain embodiments, the detection resistor 426 may be approximately ten kilo-ohms. An input anode of the optocoupler 424 is electrically coupled with the non-isolated power source 408.

An output emitter of optocoupler 424 is electrically coupled with the isolated ground 406. An output collector of the optocoupler 424 is electrically coupled with the interrupt port 428 of the isolated CPU 402. An output voltage port 430 of isolated CPU 402 provides a bias current via pull-up resistor 432 to the output collector of optocoupler 424. In some embodiments, the pull-up resistor 432 may be between ten kilo-ohms and one mega-ohm. In certain embodiments, the pull-up resistor 432 may be approximately one hundred kilo-ohms. In other embodiments, the pull-up resistor 432 may be integrated within isolated CPU 402. An output emitter of optocoupler 432 is electrically coupled with isolated ground 406.

When an active low series of pulses (i.e. a first digital communication signal) are received on the non-isolated receive port 416, the optocoupler 424 transitions the output collector to a low state to active a wake signal via the interrupt port 428. The active low series of pulses may be the first preamble previously disclosed. The isolated CPU 402 may disable output voltage port 430 during the wake state to reduce the bias current into the output collector of optocoupler 424, even though the input cathode is still being driven continuously by the first digital communication signal.

In some embodiments, the optocoupler 424 may be a phototransistor optocoupler such as a Fairchild Semiconductor® 4N25, 4N28, 4N36, or the like type of phototransistor optocoupler. While being inexpensive, the optocoupler 424 would not be normally be a design consideration for directly monitoring a received signal in low power applications (e.g., sleep state applications) having a bit rate over a few tens of kilobits per second. For example, optocouplers typically have turn "on" times of two or more microseconds and similar turn "off" times. In contrast, a CAN bus receiver may be required to operate up to one megabit per second. This bit rate has an "on" time of just one microsecond making the optocoupler impractical for receiving CAN bus data. Additionally, current transfer ratios (CTRs) of optocouplers are typically less than 100% and degrade with increases in temperature.

Even though the first digital communication received on the non-isolated receive port 416 may far exceed the ability of the optocoupler 424 to respond to individual bits, the optocoupler 424 only needs to signal presence of a transmission and not actual content. The turn-off time of the optocoupler 424 (i.e. slowest time) is inversely related to the bias current. This relationship allows the use of a high impedance value for pull-up resistor 432. This also permits the optocoupler 424 to be a very inefficient type and less expensive. Turn-on time is not significantly degraded by the lower currents, so this still achieves a relatively fast turn-on response to activate the wake state of isolated CPU 402.

In addition, to receiving a preamble before a data packet to generate the wake state and still allow time to power digital isolator 302, a "break" transmission may be received on the non-isolated receive port 416. As example, the limited maximum "mark" time of a CAN bus transceiver is long enough to turn on even a very slow optocoupler. Basically, any series of bits or bytes that are not part of data to be processed by the isolated CPU 402 and that will not be confused as legitimate data and/or commands may be used. The average direct current (DC) input to the input cathode of the optocoupler 424 is a pulse width modulated (PWM) function combined with the value of detection resistor 426.

Figure 5:
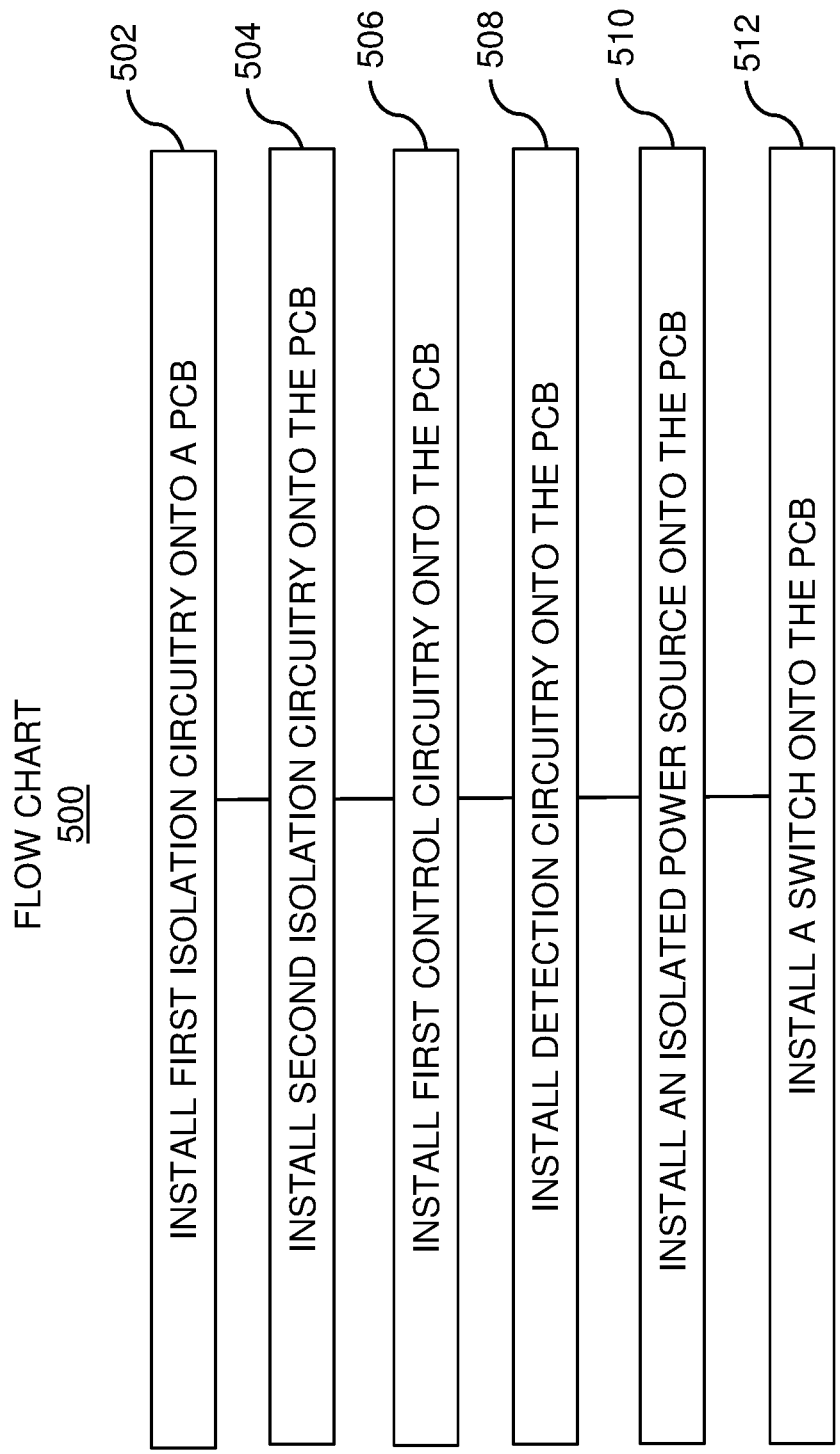
FIG. 5 depicts a flowchart illustrating a method of manufacture for an apparatus (e.g., the apparatus of FIG. 1) in accordance with embodiments of the present disclosure.

FIG. 5 depicts a flowchart 500 illustrating a method of manufacture for an apparatus having a PCM in accordance with embodiments of the present disclosure. For example, the method may be used to manufacture the apparatus 102 of FIG. 1. The method may include a thru-hole technology (THT) assembly process and/or a surface mount technology (SMT) assembly process.

In step 502, the method includes installing first isolation circuitry onto the PCB. The first isolation circuitry includes a first primary interface and a first secondary interface. Additionally, the first primary interface is galvanically isolated from the first secondary interface.

In step 504, the method further includes installing second isolation circuitry onto the PCB. The second isolation circuitry includes a second primary interface and a second secondary interface. Additionally, the second primary interface is galvanically isolated from the second secondary interface.

In step 506, the method further includes installing first control circuitry onto the PCB. The first control circuitry is electrically coupled with the first secondary interface and the second secondary interface and the first control circuitry is configured to transition the apparatus from a sleep state to a wake state upon receiving a wake signal. Additionally, the first isolation circuitry is configured to provide the wake signal to the first control circuitry via the first secondary interface.

In step 508, the method further includes installing detection circuitry onto the PCB. The detection circuitry is electrically coupled between the first primary interface and the second primary interface. Additionally, the detection circuitry is configured to provide a wake signal to the first primary interface upon detecting a first digital communication signal arriving at the second primary interface.

In step 510, the method further includes installing an isolated power source onto the PCB. The isolated power source may be a battery, a capacitor, and/or the like.

In step 512, the method further includes installing a switch onto the PCB. The switch is electrically coupled between the isolated power source and the second isolation circuitry. Additionally, the switch is electrically coupled with the first control circuitry.

Figure 6:
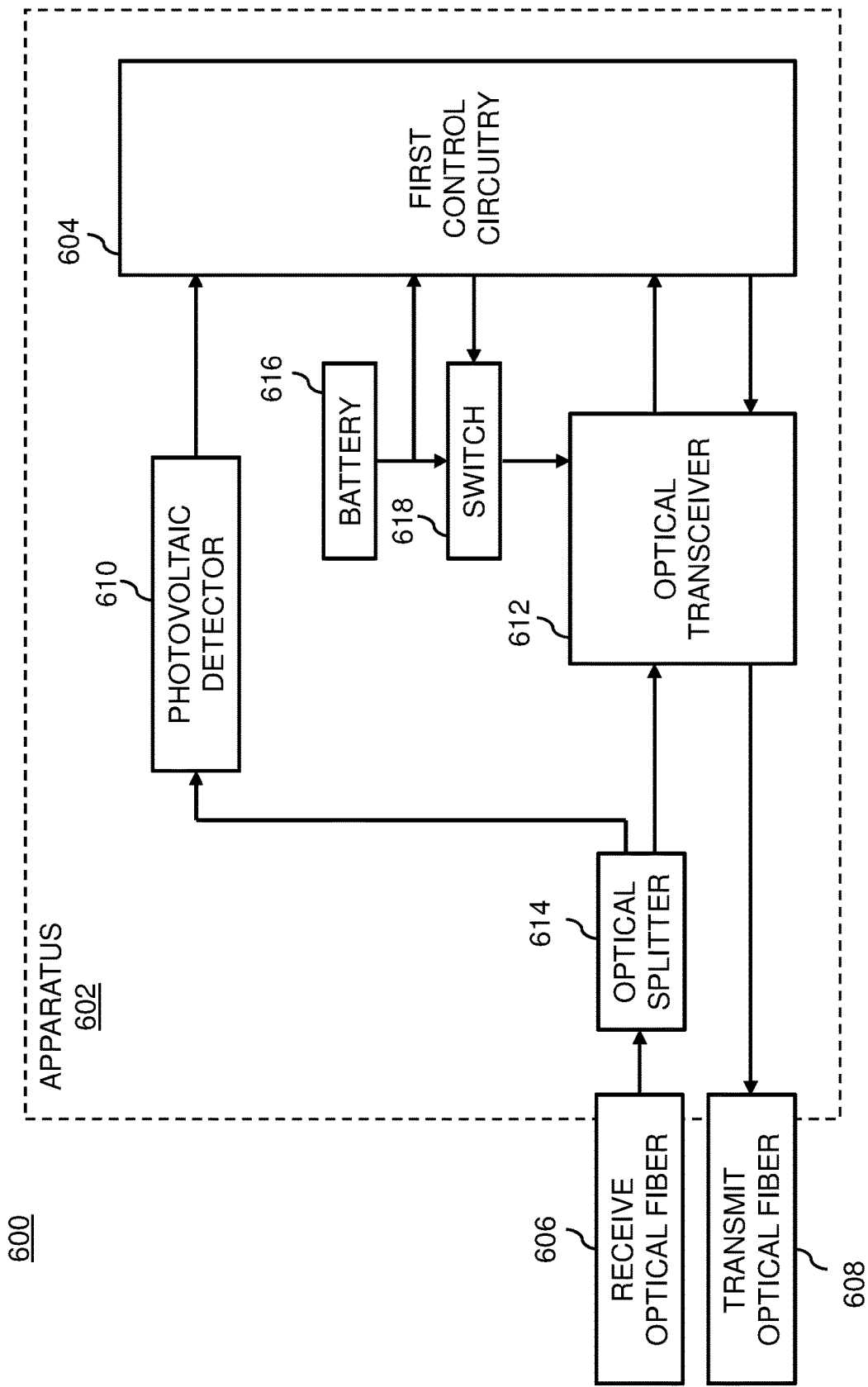
FIG. 6 depicts a block diagram illustrating another apparatus configured for galvanic isolation (via fiber optic connections) in accordance with embodiments of the present disclosure.

FIG. 6 depicts a block diagram 600 illustrating an apparatus 602 configured for galvanic isolation via fiber optic connections in accordance with embodiments of the present disclosure. The apparatus 602 includes first control circuitry 604 configured to communicate bi-directionally with second control circuitry (not shown in FIG. 6) using receive optical fiber 606 and transmit optical fiber 608. The apparatus 602 also includes photovoltaic detector 610 (i.e. first isolation circuitry), optical transceiver 612 (i.e. second isolation circuitry), an optical splitter 614, a battery 616 (i.e. an isolated power source), and a switch 618. The first control circuitry may be the isolated CPU 402 of FIG. 4 or the like. The switch 618 may be a P-channel enhancement mode MOSFET switch as shown in FIG. 4. For example, the apparatus 602 may be a low power sensor device for deployment in hazardous environments.

The first control circuitry 604 is electrically coupled with the optical transceiver 612. The optical transceiver 612 is optically coupled with the receive optical fiber 606 via optical splitter 614. The optical transceiver 612 is also optically coupled with transmit optical fiber 608. The first control circuitry 604 is configured to transition the apparatus 602 from a sleep state to a wake state.

The battery 616 is configured to provide power to the optical transceiver 612 via the switch 618. The switch 618 is configured to be activated and deactivated by the first control circuitry 604.

The first control circuitry 604 is configured to receive a first digital communication signal from the second control circuitry via the receive optical fiber 606 and the optical transceiver 612. The first control circuitry is further configured to transmit a second digital communication signal to the second control circuitry via the optical transceiver 612 and transmit optical fiber 608.

The optical splitter 614 is configured to provide the first digital communication signal to the optical transceiver 614 and the photovoltaic detector 610. The photovoltaic detector provides a wake signal to the first control circuitry 604 upon receiving first digital communication signal. The first control circuitry then transitions from a sleep state to a wake state and enables power to the optical transceiver via the switch 618.

In certain embodiments, the photovoltaic detector 610 includes a photodiode configured in a zero (or near zero) bias mode. In this embodiment, the photodiode is electrically coupled with a resistor. As the first digital communication signal is optically received, current flows from the photodiode and builds a voltage across the resistor. The voltage across the resistor creates the wake signal for the first control circuitry 604. The first control circuitry may be further configured to discharge the voltage.

In some embodiments, the apparatus 602 may provide a compliant interface to a media oriented systems transport (MOST) bus, or the like.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   first isolation circuitry having a first primary interface and a first secondary interface, wherein the first primary interface is galvanically isolated from the first secondary interface;
   second isolation circuitry having a second primary interface and a second secondary interface, wherein the second primary interface is galvanically isolated from the second secondary interface; and first control circuitry electrically coupled with the first secondary interface and the second secondary interface, wherein:

the first control circuitry is configured to transition the apparatus from a sleep state to a wake state upon receiving a wake signal; and the first isolation circuitry is configured to provide the wake signal to the first control circuitry via the first secondary interface.

2. The apparatus of claim 1, wherein the first control circuitry is configured to receive a first digital communication signal from second control circuitry via the second isolation circuitry.

3. The apparatus of claim 2, wherein the first control circuitry is further configured to transmit a second digital communication signal to the second control circuitry via the second isolation circuitry.

4. The apparatus of claim 2, wherein the first control circuitry is galvanically isolated from the second control circuitry.

5. The apparatus of claim 2 further comprising detection circuitry electrically coupled between the first primary interface and the second primary interface.

6. The apparatus of claim 5, wherein the detection circuitry is configured to provide the wake signal to the first primary interface upon detecting the first digital communication signal arriving at the second primary interface.

7. The apparatus of claim 1, wherein the second isolation circuitry is configured to be powered down during the sleep state and powered up during the wake state.

8. The apparatus of claim 1, wherein the first isolation circuitry comprises an optocoupler.

9. The apparatus of claim 8, wherein the optocoupler comprises:

a pair of input terminals configured to receive the wake signal; and an output transistor having a collector and an emitter wherein:

the collector is electrically coupled with the first control circuitry; and the collector is configured to provide the wake signal to the first control circuitry.

10. The apparatus of claim 8, wherein the second isolation circuitry comprises a digital isolator.

11. The apparatus of claim 1, wherein the first isolation circuitry comprises a first transformer.

12. The apparatus of claim 11, wherein the second isolation circuitry comprises a second transformer.

13. The apparatus of claim 1 further comprising a battery, wherein the battery is configured to power the second secondary interface of the second isolation circuitry during the wake state.

14. The apparatus of claim 1 further comprising a capacitor, wherein the capacitor is configured to power the second secondary interface of the second isolation circuitry during the wake state.

15. The apparatus of claim 1, wherein:

the first isolation circuitry comprises a photovoltaic detector; and the second isolation circuitry comprises an optical transceiver.

16. A method of operating an apparatus, the method comprising:

receiving a first digital communication signal, wherein the apparatus comprises:

first isolation circuitry having a first primary interface and a first secondary interface, wherein the first primary interface is galvanically isolated from the first secondary interface;

second isolation circuitry having a second primary interface and a second secondary interface, wherein the second primary interface is galvanically isolated from the second secondary interface; and first control circuitry electrically coupled with the first secondary interface and the second secondary interface;

generating a wake signal upon receiving the first digital communication signal;

providing the wake signal to the first control circuitry using the first isolation circuitry; and transitioning the first control circuitry from a sleep state to a wake state.

17. The method of claim 16 further comprising transitioning the second isolation circuitry from a power-down state to a power-up state upon transitioning the first control circuitry from the sleep state to the wake state.

18. The method of claim 17 further comprising providing a portion of the first digital communication signal to the first control circuitry via the second isolation circuitry.

19. The method of claim 18, wherein the first digital communication signal comprises a first preamble and a first data packet.

20. The method of claim 19 further comprising providing a second digital communication signal from the first control circuitry to second control circuitry via the second isolation circuitry.

21. The method of claim 20, wherein the second digital communication signal comprises a second preamble and a second data packet.

22. A method of manufacture of an apparatus, the method comprising:

installing first isolation circuitry onto a printed circuit board (PCB), wherein:

the first isolation circuitry includes a first primary interface and a first secondary interface; and the first primary interface is galvanically isolated from the first secondary interface;

installing second isolation circuitry onto the PCB, wherein:

the second isolation circuitry includes a second primary interface and a second secondary interface; and the second primary interface is galvanically isolated from the second secondary interface; and installing first control circuitry onto the PCB, wherein:

the first control circuitry is electrically coupled with the first secondary interface and the second secondary interface;

the first control circuitry is configured to transition the apparatus from a sleep state to a wake state upon receiving a wake signal; and the first isolation circuitry is configured to provide the wake signal to the first control circuitry via the first secondary interface.

23. The method of claim 22 further comprising:

installing detection circuitry onto the PCB, wherein:

the detection circuitry is electrically coupled between the first primary interface and the second primary interface; and the detection circuitry is configured to provide a wake signal to the first primary interface upon detecting a first digital communication signal arriving at the second primary interface;

installing an isolated power source onto the PCB; and
installing a switch onto the PCB; wherein;
  the switch is electrically coupled between the isolated power source and the second isolation circuitry; and
  the switch is electrically coupled with the first control circuitry.

* * * * *